(12) United States Patent
Hill et al.

(10) Patent No.: US 10,351,257 B2
(45) Date of Patent: Jul. 16, 2019

(54) RETENTION MEMBER MONITORING SYSTEM FOR SLAT-FLAP CONTROL LEVER

(71) Applicant: HAMILTON SUNDSTRAND CORPORATION, Charlotte, NC (US)

(72) Inventors: David G. Hill, Rockford, IL (US); Cory M. Crandall-Seibert, Delavan, WI (US); Rachel Gallagher, Rockford, IL (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 0 days.

(21) Appl. No.: 15/718,988

(22) Filed: Sep. 28, 2017

(65) Prior Publication Data
US 2019/0092490 A1 Mar. 28, 2019

(51) Int. Cl.
*G01L 5/00* (2006.01)
*B64D 45/00* (2006.01)
*B64C 13/10* (2006.01)
*G01R 31/07* (2006.01)

(52) U.S. Cl.
CPC ............. *B64D 45/00* (2013.01); *B64C 13/10* (2013.01); *G01L 5/00* (2013.01); *G01R 31/07* (2013.01)

(58) Field of Classification Search
CPC ... G01L 5/00; G01L 1/005; G01L 1/22; G01L 5/10; G01L 9/04; G01R 31/07; B64D 45/00; B64D 13/10
USPC ...................................................... 73/862.68
See application file for complete search history.

(56) References Cited

U.S. PATENT DOCUMENTS

| 1,987,066 | A | * | 1/1935 | Kingston | ............... B64D 31/04 244/234 |
| 3,473,760 | A | | 10/1969 | Vaiden | |
| 5,058,451 | A | | 10/1991 | Fujimoto et al. | |
| 6,483,436 | B1 | * | 11/2002 | Emaci | ............... B64D 45/0005 244/194 |
| 7,648,106 | B2 | | 1/2010 | Granier et al. | |
| 8,123,177 | B2 | * | 2/2012 | Kummle | ................. B64C 13/04 244/236 |
| 8,516,898 | B2 | * | 8/2013 | Mayer | ...................... B64C 9/18 340/686.1 |

(Continued)

FOREIGN PATENT DOCUMENTS

| EP | 1413515 A2 | 4/2004 |
| EP | 3000725 A1 | 3/2016 |

(Continued)

OTHER PUBLICATIONS

European Patent Search Report regarding related EP App. No. 18196897.5; dated Jan. 25, 2019; 8 pgs.

*Primary Examiner* — Jonathan M Dunlap
*Assistant Examiner* — Octavia Hollington
(74) *Attorney, Agent, or Firm* — Cantor Colburn LLP

(57) ABSTRACT

A retention member monitoring system for a slat-flap control lever assembly including a control lever movable over a range of discrete angular positions. Also included is a retention member engageable with the control lever to retain the control lever in each of the discrete angular positions. Further included is at least one electric device in communication with the retention member to determine the structural integrity of the retention member.

8 Claims, 2 Drawing Sheets

(56) References Cited

U.S. PATENT DOCUMENTS

| | | | | |
|---|---|---|---|---|
| 8,950,740 | B2* | 2/2015 | Kopp | B64C 13/04 |
| | | | | 267/141.2 |
| 9,102,418 | B2* | 8/2015 | Carbone | B64D 45/0005 |
| 9,263,211 | B2* | 2/2016 | Weinreich | H01H 21/16 |
| 9,643,715 | B2 | 5/2017 | Iliescu et al. | |
| 9,726,516 | B2* | 8/2017 | Carbone | G01D 5/12 |
| 10,086,924 | B2* | 10/2018 | Crandall-Seibert | B64C 13/14 |
| 2004/0128038 | A1* | 7/2004 | Richter | B64C 13/04 |
| | | | | 701/3 |
| 2010/0025539 | A1 | 2/2010 | Hanlon et al. | |
| 2010/0241332 | A1 | 9/2010 | Andrieu | |

FOREIGN PATENT DOCUMENTS

| | | |
|---|---|---|
| EP | 3000727 A1 | 3/2016 |
| KR | 20160096432 A | 8/2016 |
| WO | 2014084809 A1 | 6/2014 |
| WO | 2014096773 A1 | 6/2014 |

\* cited by examiner

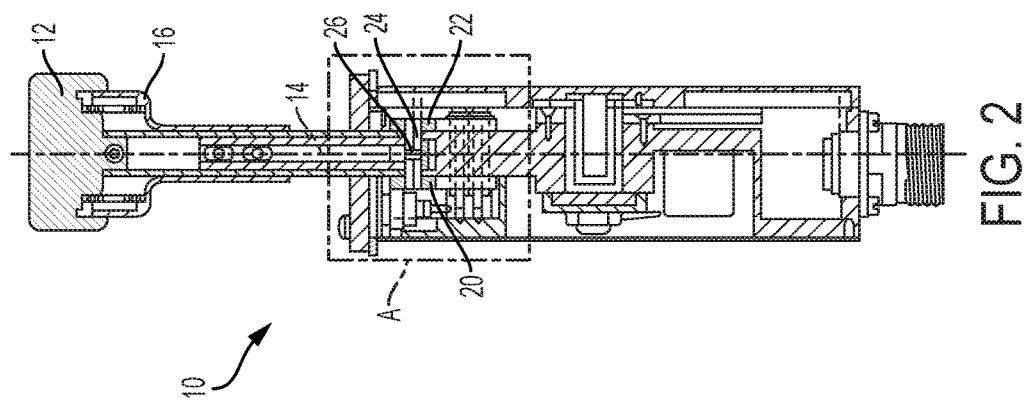
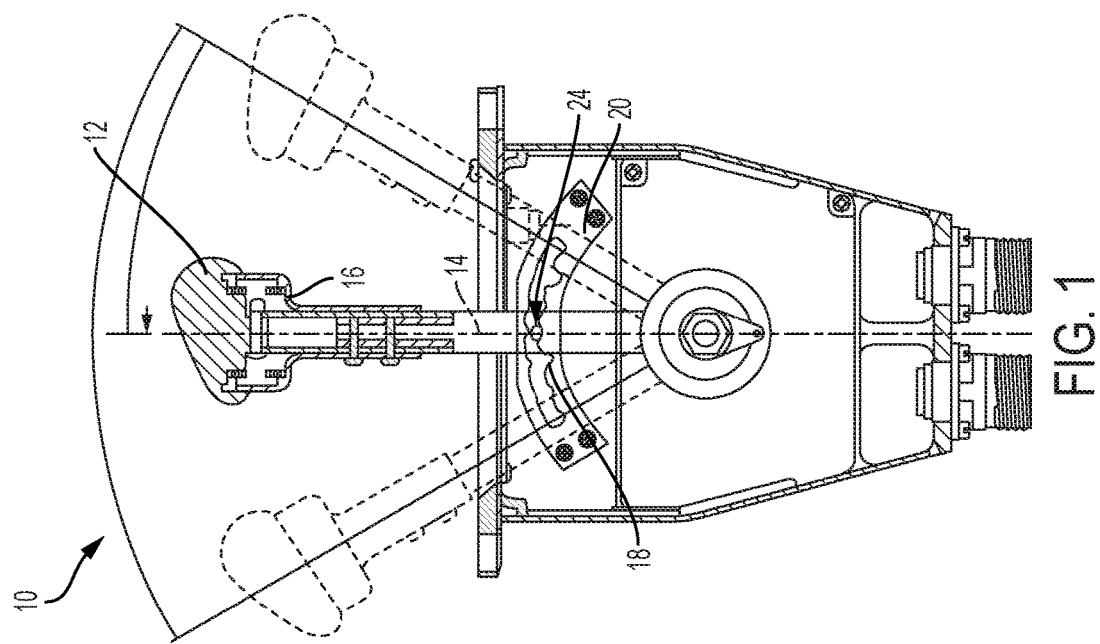

RETENTION MEMBER MONITORING SYSTEM FOR SLAT-FLAP CONTROL LEVER

BACKGROUND

Exemplary embodiments pertain to the art of slat-flap control levers for aircrafts and, more particularly, to a retention member monitoring system and method for such slat-flap control levers.

Aircraft slat and flap systems include slats and flaps that are extended and retracted at variable positions depending on the aircraft's take-off or landing situation to provide high lift to the aircraft at lower aircraft speeds. Actuation of the slats and flaps is provided in response to input from an aircraft operator. The input is made by movement of a slat-flap control lever. It is important to maintain the slat-flap control lever in a desired position to ensure desired positioning of the slats and flaps.

A typical slat-flap control lever design utilizes a detent pin and gating system to prevent the control lever from unintentional movement after it has been set. The detent pin extends out both sides of the control lever and the load share is split between both sides of the pin. Failure of one side of the pin is considered a dormant failure because the lever will operate normally without alerting the operator (e.g., pilot). Should both sides of the detent pin fail, the lever would be subject to unrestricted movement. Unrestricted movement could result in un-commanded slat-flap system motion if the lever was bumped or accidentally moved. Since a single-sided detent pin failure has been identified as a dormant failure, periodic inspections are required which must be scheduled and require aircraft downtime.

BRIEF DESCRIPTION

Disclosed is a retention member monitoring system for a slat-flap control lever assembly including a control lever movable over a range of discrete angular positions. Also included is a retention member engageable with the control lever to retain the control lever in each of the discrete angular positions. Further included is at least one electric device in communication with the retention member to determine the structural integrity of the retention member.

Also disclosed is a method of monitoring the structural integrity of a retention pin of a slat-flap control lever. The method includes electrically monitoring the structure of the retention pin with at least one electric device operatively coupled to the retention pin. The method also includes communicating an electric signal to a controller from the at least one electric device to indicate whether the retention pin has been broken.

BRIEF DESCRIPTION OF THE DRAWINGS

The following descriptions should not be considered limiting in any way. With reference to the accompanying drawings, like elements are numbered alike:

FIG. 1 is a side, elevational cross-sectional view of a slat-flap control lever;

FIG. 2 is an end sectional view of the slat-flap control lever;

DETAILED DESCRIPTION

Figure 4:
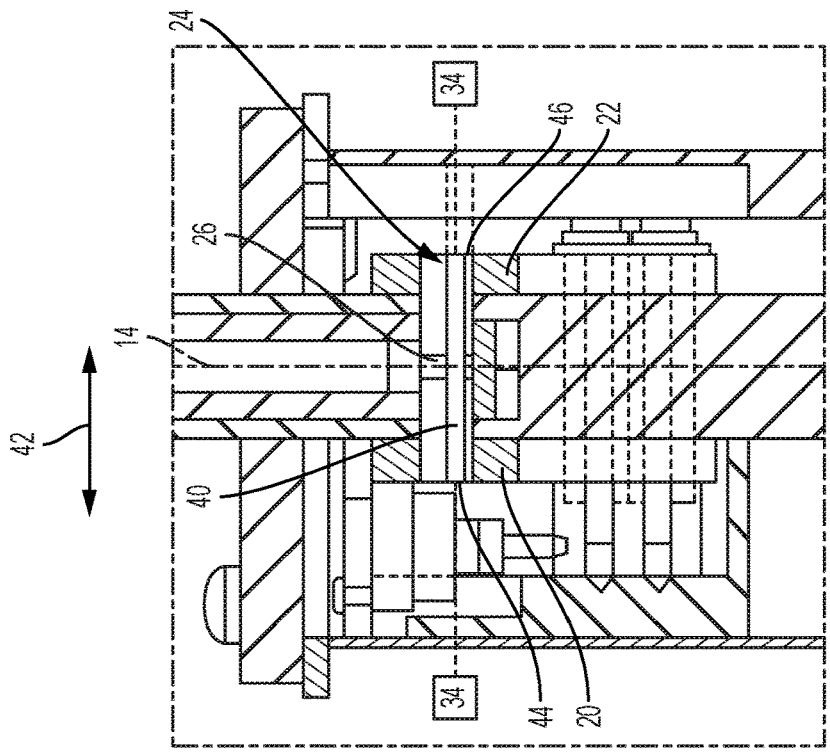
FIG. 4 an enlarged view of Section A of FIG. 2, illustrating a retaining pin monitoring device according to another aspect of the disclosure.

A detailed description of one or more embodiments of the disclosed apparatus and method are presented herein by way of exemplification and not limitation with reference to the Figures. The embodiments disclosed herein electrically monitor the structural integrity of a retaining pin that maintains a position of a slat-flap control lever, as described herein.

FIGS. 1 and 2 illustrate a slat-flap control lever assembly that is generally referenced with numeral 10. The lever assembly 10 includes a hand grip 12 for grasping by an operator (e.g., pilot) and lever 14 that controls actuation of slats and flaps associated with an aircraft wing. Also provided is a finger lift 16 that allows movement of the lever 14 when lifted by the operator. The lever 14 is rotatable over a range of angular positions, with discrete angular positions dictated by detents 18 defined by a first guide plate 20 and a second guide plate 22. The first guide plate 20 is located on a first side of the lever 14 and the second guide plate 22 is located on a second side of the lever 14.

A retention pin 24 is operatively coupled to the lever 14 proximate a mid-point 26 of the retention pin 24. The retention pin 24 passes through an aperture of the lever 14 in some embodiments. The retention pin 24 engages corresponding detents of the first and second guide plates 20, 22 at each discrete angular position of the lever, thereby securing the lever 14 at each angular position and preventing inadvertent movement thereof.

If the retention pin 24 is broken on one side of the lever 14, securing of the retention pin 24 to the first guide plate 20 or the second guide plate 22 is not provided. However, the retention pin 24 will continue to be able to secure to detents of the other guide plate 20 or 22. This is referred to as a dormant failure and requires periodic manual inspection. To avoid the undesirable aspects of dormant failures, an electric monitoring system is provided to automatically detect breakage of either side of the retention pin 24, as described herein.

Figure 3:
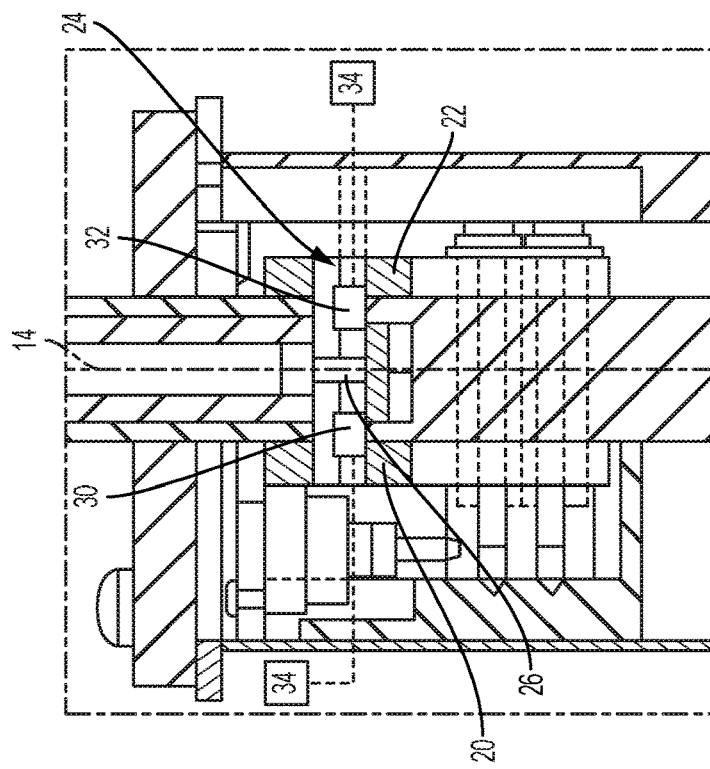
FIG. 3 is an enlarged view of Section A of FIG. 2, illustrating a retaining pin monitoring device according to an aspect of the disclosure.

Referring to FIG. 3, an embodiment of the electric monitoring system is illustrated. In particular, the electric monitoring system includes a first strain gage 30 and a second strain gage 32. The first strain gage 30 is operatively coupled to the retention pin 24 on a first side of the mid-point 26 of the retention pin 24. The second strain gage 32 is operatively coupled to the retention pin 24 on a second side of the mid-point 26 of the retention pin 24.

Each of the strain gages 30, 32 are in operative communication with a controller 34 that monitors the electric signals to determine if breakage of either side of the retention pin 24 has occurred. The strain gages 30, 32 may be in wired or wireless electrical communication with the controller 34. If one side of the retention pin 24 breaks, the strain on the remaining side would increase when the lever 14 is in motion and the controller 34 would detect the pin breakage based on the increase in strain signal. In such a situation, the controller 34 generates an alert to the operator (e.g., pilot).

Referring to FIG. 4, an embodiment of the electric monitoring system is illustrated. In particular, the electric monitoring system includes an electric fuse 40 that is disposed within the retention pin 24. The electric fuse 40 extends within the retention pin 24 along a longitudinal direction 42 of the retention pin 24. The electric fuse 40 extends from a first fuse end 44 to a second fuse end 46. The first fuse end 44 is located on a first side of the mid-point 26 of the retention pin 24 and the second fuse end 46 is located on a second side of the mid-point 26 of the retention pin 24. In some embodiments, the first fuse end 44 is located outboard of the first guide plate 20 and the second fuse end 46 is located outboard of the second guide plate 22.

The electric fuse 40 is in operative communication with the controller 34 that monitors an electric signal to determine if breakage of either side of the retention pin 24 has occurred. The electric fuse 40 is in wired electrical communication with the controller 34. If one side of the retention pin 24 breaks, electrical continuity of the fuse 40 is disrupted. In such a situation, the controller 34 generates an alert to the operator (e.g., pilot).

The embodiments disclosed herein eliminate dormant failures and make failure of one side of the retention pin 24 detectable. Typically, items with dormant failures require periodic inspection intervals resulting in aircraft downtime and maintenance actions. The disclosed embodiments renders the need for periodic inspections obsolete, while also increasing the overall safety of the slat-flap system.

The term "about" is intended to include the degree of error associated with measurement of the particular quantity based upon the equipment available at the time of filing the application.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The embodiments disclosed herein can be a system, a method, and/or a computer program product at any possible technical detail level of integration. The computer program product can include a computer readable storage medium (or media) having computer readable program instructions thereon for causing a processor to carry out aspects of the present disclosed embodiments.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A retention member monitoring system for a slat-flap control lever assembly comprising:
   a control lever movable over a range of discrete angular positions;
   a retention member engageable with the control lever to retain the control lever in each of the discrete angular positions; and
   at least one electric device in communication with the retention member to determine the structural integrity of the retention member, wherein the retention member is a retention pin, wherein the retention pin is engaged with the control lever at a mid-point of the retention pin along a longitudinal direction of the retention member, wherein the at least one electric device comprises a first strain gage and a second strain gage, the first strain gage disposed on a first side of the mid-point of the retention pin, the second strain gage disposed on a second side of the mid-point of the retention pin.

2. The retention member monitoring system of claim 1, wherein the first strain gage and the second strain gage are each in operative communication with a controller to communicate a breakage of the retention pin.

3. The retention member monitoring system of claim 2, wherein the first and second strain gages are each in wired communication with the controller.

4. The retention member monitoring system of claim 2, wherein the controller generates an alert if breakage of the retention pin is detected.

5. A retention member monitoring system for a slat-flap control lever assembly comprising:
   a control lever movable over a range of discrete angular positions;
   a retention member engageable with the control lever to retain the control lever in each of the discrete angular positions; and
   at least one electric device in communication with the retention member to determine the structural integrity of the retention member, wherein the retention member is a retention pin, wherein the retention pin is engaged with the control lever at a mid-point of the retention pin along a longitudinal direction of the retention member, wherein the at least one electric device is an electric fuse disposed within the retention pin, the electric fuse extending along the longitudinal direction of the retention pin from a location on a first side of the mid-point to a location on a second side of the mid-point.

6. The retention member monitoring system of claim 5, wherein the electric fuse is in operative communication with a controller to communicate a breakage of the retention pin when the electric fuse is broken.

7. The retention member monitoring system of claim 6, wherein the electric fuse is in wired communication with the controller.

8. The retention member monitoring system of claim 6, wherein the controller generates an alert if breakage of the retention pin is detected.

* * * * *